United States Patent
Lee et al.

(10) Patent No.: US 10,100,225 B2
(45) Date of Patent: Oct. 16, 2018

(54) CMP SLURRY COMPOSITION FOR METAL WIRING AND POLISHING METHOD USING THE SAME

(71) Applicant: SAMSUNG SDI CO., LTD., Yongin-si, Gyeonggi-do (KR)

(72) Inventors: So Hyung Lee, Suwon-si (KR); Keun Bong Do, Suwon-si (KR); Dong Jin Kim, Suwon-si (KR); Kang Su An, Suwon-si (KR); Young Chul Jung, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/371,316

(22) Filed: Dec. 7, 2016

(65) Prior Publication Data

US 2017/0166779 A1    Jun. 15, 2017

(30) Foreign Application Priority Data

Dec. 11, 2015   (KR) ......................... 10-2015-0177498

(51) Int. Cl.
*C09G 1/02* (2006.01)
*C23F 11/04* (2006.01)
*C23F 3/04* (2006.01)
*H01L 21/321* (2006.01)

(52) U.S. Cl.
CPC ............... *C09G 1/02* (2013.01); *C23F 3/04* (2013.01); *C23F 11/04* (2013.01); *H01L 21/3212* (2013.01)

(58) Field of Classification Search
CPC ... C09G 1/02; C23F 3/04; C23F 11/04; H01L 21/3212
See application file for complete search history.

(56) References Cited

U.S. PATENT DOCUMENTS

| | | | |
|---|---|---|---|
| 2003/0104699 A1 | 6/2003 | Minamihaba et al. | |
| 2010/0207058 A1* | 8/2010 | Matsumura | C09G 1/02 252/79.1 |
| 2014/0349484 A1* | 11/2014 | Yokota | H01L 21/3212 438/693 |

FOREIGN PATENT DOCUMENTS

| | | |
|---|---|---|
| CN | 101608098 A | 12/2009 |
| CN | 101802981 A | 8/2010 |
| CN | 104025265 A | 9/2014 |
| KR | 10-2010-0077748 A | 7/2010 |
| KR | 10-2010-0108397 A | 10/2010 |

OTHER PUBLICATIONS

Korean Office Action dated Aug. 4, 2017 in the corresponding Korean Patent Application No. 10-2015-0177498.
Chinese Office Action dated Apr. 16, 2018 in the corresponding Chinese Patent Application No. 201611114783.1.

* cited by examiner

*Primary Examiner* — Duy Vu N Deo
(74) *Attorney, Agent, or Firm* — Lee & Morse, P.C.

(57) ABSTRACT

A CMP slurry composition for polishing a metal wire and a polishing method, the CMP slurry composition including polishing particles; an oxidant; a complexing agent; a corrosion inhibitor; and deionized water, wherein the corrosion inhibitor includes an inorganic nitrite or ammonium nitrate.

18 Claims, No Drawings

CMP SLURRY COMPOSITION FOR METAL WIRING AND POLISHING METHOD USING THE SAME

CROSS-REFERENCE TO RELATED APPLICATION

Korean Patent Application No. 10-2015-0177498, filed on Dec. 11, 2015, in the Korean Intellectual Property Office, and entitled: "CMP Slurry Composition for Metal Wiring and Polishing Method Using the Same," is incorporated by reference herein in its entirety.

BACKGROUND

1. Field

Embodiments relate to a CMP slurry composition for metal wiring and a polishing method using the same.

2. Description of the Related Art

In fabrication of semiconductor devices, a CMP process is a process which is used in planarization of a surface of a wafer with a polishing pad and a slurry composition and in which, after the polishing pad is brought into contact with the wafer, the surface of the wafer is polished using the slurry composition including a polishing agent during orbital motion of the polishing pad and the wafer including a translation motion component and a rotational motion component.

A slurry composition used in the CMP process may be composed of polishing particles for physical action and a compound for chemical action, such as an etchant. Thus, the slurry composition may selectively etch an exposed surface of a wafer through physical action and chemical action, thereby facilitating further optimized large-area planarization.

SUMMARY

Embodiments are directed to a CMP slurry composition for metal wiring and a polishing method using the same.

The embodiments may be realized by providing a CMP slurry composition for polishing a metal wire, the CMP slurry composition including polishing particles; an oxidant; a complexing agent; a corrosion inhibitor; and deionized water, wherein the corrosion inhibitor includes an inorganic nitrite or ammonium nitrate.

The inorganic nitrite may include sodium nitrite, potassium nitrite, ammonium nitrite, or a combination thereof.

The inorganic nitrite or ammonium nitrate may be present in an amount of 0.001 wt % to 10 wt %, based on a total weight of the CMP slurry composition.

The CMP slurry composition may further include a surfactant, a polymeric compound, a dispersant, a pH regulator, or a combination thereof.

The CMP slurry composition may include about 0.01 wt % to about 20 wt % of the polishing particles; about 0.01 wt % to about 10 wt % of the oxidant; about 0.01 wt % to about 20 wt % of the complexing agent; and about 0.001 wt % to about 10 wt % of the corrosion inhibitor, all wt % being based on a total weight of the CMP slurry composition.

The CMP slurry composition may have a static etch rate of about 50 Å/min or less, as measured for a cobalt film.

The CMP slurry composition may have a static etch rate of about 30 Å/min or less, as measured for a copper film.

The CMP slurry composition may have a removal rate non-uniformity of about 20% or less.

The embodiments may be realized by providing a polishing method including polishing metal wires using the CMP slurry composition according to an embodiment.

The inorganic nitrite may include sodium nitrite, potassium nitrite, ammonium nitrite, or a combination thereof.

The inorganic nitrite or ammonium nitrate may be present in an amount of 0.001 wt % to 10 wt %, based on a total weight of the CMP slurry composition.

The CMP slurry composition may further include a surfactant, a polymeric compound, a dispersant, a pH regulator, or a combination thereof.

The CMP slurry composition may include about 0.01 wt % to about 20 wt % of the polishing particles; about 0.01 wt % to about 10 wt % of the oxidant; about 0.01 wt % to about 20 wt % of the complexing agent; and about 0.001 wt % to about 10 wt % of the corrosion inhibitor, all wt % being based on a total weight of the CMP slurry composition.

The CMP slurry composition may have a static etch rate of about 50 Å/min or less, as measured for a cobalt film.

The CMP slurry composition may have a static etch rate of about 30 Å/min or less, as measured for a copper film.

The CMP slurry composition may have a removal rate non-uniformity of about 20% or less.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present.

A CMP slurry composition according to an embodiment may be capable of inhibiting corrosion of both a copper wire and an auxiliary metal layer formed of a metal such as cobalt (Co) or ruthenium (Rb). For example, at least one inorganic corrosion inhibitor may be used as a corrosion inhibiter. In an implementation, the inorganic corrosion inhibitor may include a nitrite (e.g., inorganic nitrite) or ammonium nitrate.

For example, a CMP slurry composition according to an embodiment may be used in polishing of a metal wire used as a conductive layer of a semiconductor device. The CMP slurry composition may include, e.g., (A) polishing particles, (B) an oxidant, (C) a complexing agent, (D) a corrosion inhibitor, and (E) deionized water. In an implementation, the corrosion inhibitor may include, e.g., an inorganic nitrite or ammonium nitrate.

(A) Polishing Particles

As the polishing particles, suitable polishing particles may be used. For example, the polishing particles may be inorganic particles, organic particles, or a combination thereof.

Examples of the inorganic particles may include fine particles of a metal oxide such as silica ($SiO_2$), alumina ($Al_2O_3$), ceria ($CeO_2$), zirconia ($ZrO_2$), titania ($TiO_2$), and molybdenum oxide ($MoO_3$). In an implementation, silica may be advantageous in terms of dispersion stability and scratch resistance of the slurry composition.

Examples of the organic particles may include particles of polystyrene, poly(methyl methacrylate), polyvinyl chloride, polyacetal, polyester, polyamide, polyimide, and a copolymer thereof.

The inorganic particles and/or the organic particles may be used alone or as a mixture thereof.

In an implementation, the inorganic particles or the organic particles may have an average particle diameter (D50) of about 10 nm to about 500 nm. Within this range of average particle diameter, the polishing particles may help provide excellent properties in terms of polishing rate and polishing uniformity.

The polishing particles may be present in an amount of, e.g., about 0.01 wt % to about 20 wt %, based on the total weight of the slurry composition. In an implementation, the polishing particles may be present in an amount of about 0.05 wt % to about 20 wt % or about 0.1 wt % to about 20 wt %, e.g., 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %, in the slurry composition. Within this range, the slurry composition may exhibit excellent dispersion stability and removal rate.

(B) Oxidant

The oxidant may induce chemical polishing by oxidizing a surface of a metal layer, e.g., a copper layer, which is a polishing object.

In an implementation, the oxidant may include, e.g., inorganic or organic per-compounds, bromic acid and salts thereof, nitric acid and salts thereof, chloric acid and salts thereof, chromic acid and salts thereof, iodic acid and salts thereof, iron and salts thereof, copper and salts thereof, rare-earth metal oxides, transition metal oxides, potassium ferricyanide, potassium dichromate, or the like. In an implementation, hydrogen peroxide may be used as the oxidant.

In an effort to obtain an appropriate polishing rate while reducing corrosion or pitting upon polishing, the oxidant may be present in an amount of, e.g., about 0.01 wt % to about 10 wt % or about 0.1 wt % to about 5 wt % in the slurry composition. In an implementation, the oxidant may be present in an amount of, e.g., 0.1 wt %, 0.5 wt %, 1 wt %, 1.5 wt %, 2 wt %, 2.5 wt %, 3 wt %, 3.5 wt %, 4 wt %, 4.5 wt %, or 5 wt % in the slurry composition. Within this range, it is possible to help reduce corrosion or pitting upon polishing and to further improve polishing rate and polishing uniformity.

(C) Complexing Agent

The complexing agent may chelate copper oxide oxidized by the oxidant. For example, the copper oxide oxidized by chelation with the copper oxide may be suppressed from being re-adsorbed onto the copper layer, which is a polishing object, whereby a polishing rate for copper may be increased while reducing surface defects.

In an implementation, the complexing agent may include, e.g., organic acids and salts thereof, amino acids and salts thereof, alcohols such as di-alcohol, tri-alcohol, and polyalcohol, amine-containing compounds, or the like. These may be used alone or in combination thereof.

In an implementation, the complexing agent may include, e.g., ammonium acetate, ammonium oxalate, ammonium formate, ammonium tartrate, ammonium lactate, glycine, alanine, serine, aspartic acid, glutamic acid, proline, oxyproline, arginine, cysteine, histidine, tyrosine, leucine, lysine, methionine, valine, isoleucine, trionine, tryptophan, phenylalanine, ammonium tetrahydrate, amimobenzotriazole, aminobutyric acid, aminoethylaminoethanol, aminopyridine, carbonyl compounds and salts thereof, and carboxylic acid compounds and salts thereof, for example, carboxylic acid compounds containing at least one hydroxyl group and salts thereof, dicarboxylic acid compounds and salts thereof, tricarboxylic acid compounds and salts thereof, polycarboxylic acid compounds and salts thereof, or carboxylic acid compounds containing at least one sulfonic acid group and phosphorous (or phosphoric) acid group and salts thereof. These may be used alone or as a mixture thereof.

With a view towards polishing rate, dispersion stability of slurries, surface properties of a polishing object, improvement in wafer profile and large-area planarization, the complexing agent may be present in an amount of, e.g., about 0.01 wt % to about 20 wt %, about 0.1 wt % to about 10 wt %, or about 1 wt % to about 10 wt % in the CMP slurry composition. In an implementation, the complexing agent may be present in an amount of, e.g., 1 wt %, 2 wt %, 3 wt %, 4 wt %, 5 wt %, 6 wt %, 7 wt %, 8 wt %, 9 wt %, or 10 wt % in the CMP slurry composition. Within this range, the composition may help further improve the polishing rate, dispersion stability of slurries, surface properties of a polishing object, wafer profile, and large-area planarization.

(D) Corrosion Inhibitor

The corrosion inhibitor may be a polishing regulator that facilitates polishing by allowing removal through physical action of the polishing particles in a high step height area in which polishing occurs, while delaying chemical reaction of the oxidant to suppress corrosion in a low step height area in which polishing does not occur.

In an implementation, the CMP slurry composition may include at least one inorganic corrosion inhibitor. For example, the inorganic corrosion inhibitor may include a nitrite (e.g., inorganic nitrite) or ammonium nitrate. When a nitrite, ammonium nitrate, or a combination thereof is used as the corrosion inhibitor, it is possible to provide further improved corrosion inhibition for a metal such as cobalt and ruthenium.

Examples of the nitrite may include sodium nitrite, potassium nitrite, ammonium nitrite and combinations thereof.

In an implementation, the least one inorganic corrosion inhibitor (e.g., the inorganic nitrite or ammonium nitrate) may be present in an amount of, e.g., about 0.001 wt % to about 10.0 wt % or about 0.01 wt % to about 5.0 wt % in the CMP slurry composition. Within this range, it is possible to help suppress excessive chemical loss of a copper wire and an auxiliary metal layer while improving polishing uniformity.

In an implementation, in addition to the inorganic corrosion inhibitor, the CMP slurry composition may further include an organic corrosion inhibitor. Examples of the organic corrosion inhibitor may include an isomeric mixture of 1,2,3-triazole, 1,2,4-triazole or 2,2'-[[(5-methyl-1H-benzotriazole-1-yl)-methyl]imino]bis-ethanol.

With a view towards corrosion inhibition, polishing rate, dispersion stability of the slurry composition, and surface properties of a polishing object, the corrosion inhibitor may be present in a total amount of, e.g., about 0.001 wt % to about 10 wt %, about 0.001 wt % to about 5 wt %, or about 0.001 wt % to about 3 wt % in the CMP slurry composition. In an implementation, the corrosion inhibitor may be present in an amount of, e.g., 0.001 wt %, 0.01 wt %, 0.1 wt %, 0.5 wt %, 1 wt %, 1.5 wt %, 2 wt %, 2.5 wt %, or 3 wt % in the CMP slurry composition. Within this range, the composition may help further improve corrosion inhibition, the polishing rate, dispersion stability, and surface properties of a polishing object.

(E) Deionized Water

The above components may be suspended, dispersed, or dissolved in deionized water and prepared into a slurry. In an implementation, the slurry may have a pH of about 5 to about 9, e.g., about 6 to about 8. Within this range, it is possible to provide improved inhibition of corrosion of a copper layer.

In an implementation, the CMP slurry composition may include, e.g., about 0.01 wt % to about 20 wt % of the polishing particles, 0.01 wt % to about 10 wt % of the oxidant, about 0.01 wt % to about 20 wt % of the complexing agent, 0.001 wt % to about 10 wt % of the corrosion inhibitor. In an implementation, the CMP slurry composition may include a balance of deionized water (e.g., in addition to the amounts of components described above). When amounts of the above components are within the above ranges, the CMP slurry composition may exhibit further improved properties in terms of corrosion inhibition, polishing rate, dispersion stability, and polishing uniformity.

In an implementation, in addition to the components as set forth above, the CMP slurry composition may further include a suitable additive, such as a surfactant, a modifier, a polymeric compound, a dispersant, and a pH regulator.

The CMP slurry composition can provide excellent corrosion inhibition with respect to a copper wire and an auxiliary metal layer.

In an implementation, the CMP slurry composition may have a static etch rate (SER) of about 50 Å/min or less, about 10 Å/min or less, or about 0.1 Å/min to about 10 Å/min, e.g., 0.1 Å/min, 0.2 Å/min, 0.3 Å/min, 0.4 Å/min, 0.5 Å/min, 0.6 Å/min, 0.7 Å/min, 0.8 Å/min, 0.9 Å/min, 1 Å/min, 2 Å/min, 3 Å/min, 4 Å/min, 5 Å/min, 6 Å/min, 7 Å/min, 8 Å/min, 9 Å/min, or 10 Å/min, as measured for a cobalt film. A method for determining SER is described below with the Examples.

In an implementation, the CMP slurry composition may have a static etch rate (SER) of about 30 Å/min or less or about 10 Å/min to about 30 Å/min, e.g., 10 Å/min, 11 Å/min, 12 Å/min, 13 Å/min, 14 Å/min, 15 Å/min, 16 Å/min, 17 Å/min, 18 Å/min, 19 Å/min, 20 Å/min, 21 Å/min, 22 Å/min, 23 Å/min, 24 Å/min, 25 Å/min, 26 Å/min, 27 Å/min, 28 Å/min, 29 Å/min, or 30 Å/min, as measured for a copper film.

In an implementation, the CMP slurry composition may have a removal rate non-uniformity of about 20% or less or about 1% to 20%, e.g., 1%, 2%, 3%, 4%, 5%, 6%, 7%, 8%, 9%, 10%, 11%, 12%, 13%, 14%, 15%, 16%, 17%, 18%, 19%, or 20%.

In an implementation, the CMP slurry composition may have about 600 ea or fewer defects, e.g. about 400 ea or fewer defects.

Thus, the CMP slurry composition according to an embodiment may be used in polishing of a metal wire of a semiconductor device, e.g. a metal wire having an auxiliary metal layer formed thereon.

In accordance with another embodiment, a method of polishing a metal wire may include polishing a metal wire using the CMP slurry composition as set forth above.

EXAMPLES

Next, the present invention will be explained in more detail with reference to some examples. The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Details of components used in the following Examples and Comparative Examples are as follows:

(A) Polishing particles: Silica N27 (Nalco Chemical Company, average particle diameter: 28 nm)

(B) Oxidant: Hydrogen peroxide (DONGWOO FINE-CHEM CO., LTD.)

(C) Complexing agent: Glycine (JLCHEM CO., LTD.)

(D) Corrosion inhibitor (d1) Potassium nitrite (Sigma-Aldrich Co., Ltd.)

(d2) Ammonium nitrate (Samchun Chemical Co., Ltd.)

(d3) Cerium nitrate (Sigma-Aldrich Co., Ltd.)

(d4) Nickel nitrate (Sigma-Aldrich Co., Ltd.)

(d5) Zinc nitrate (Sigma-Aldrich Co., Ltd.)

(d6) 1,2,3-triazole (JLCHEM CO., LTD.)

Components listed in Table 1 were mixed with deionized water in amounts as listed in Table 1, thereby preparing a CMP slurry composition. Then, the CMP slurry composition was evaluated as to the following properties. Results are shown in Table 1.

<Polishing Conditions>

Wafer for measurement of polishing rate: 300 mm Cu Blanket wafer

Polishing instrument: Reflexion LK 300 mm (AMAT Co., Ltd.)

Polishing pad: CUP4410 (DOW CHEMICALS)

Polishing time: 30 s

Pressure: 2.65 psi

Platen rpm: 93 rpm

Head rpm: 87 rpm

Flow rate: 250 ml/min

Property Evaluation (1) Static Etch Rate (SER) (Unit: Å/min):

After CMP slurry compositions of Examples and Comparative Examples were prepared, a Cu wafer (ADVANTECH Co., Ltd.) and a Co wafer (ADVANTECH Co., Ltd.) each having an area of 1×3 $cm^2$ were sufficiently immersed in 5 mL of each of the CMP slurry compositions. Then, the Cu wafer and the Co wafer were subjected to metal elution at a temperature of 20° C. to 25° C. for 30 minutes and 5 minutes, respectively, followed by measuring the concentration of metal ions in the composition using a spectrophotometer, and the measured concentration was converted into weight in view of molecular weight of each metal. The weight value was divided by density, followed by division by 1×3 $cm^2$ (area), thereby measuring etched thickness. Then, the measured value of etched thickness was divided by elution time, thereby finding a static etch rate in Å/min.

(2) Removal Rate Non-Uniformity (RR NU) (Unit: %):

1) Thickness of a 300 mm Cu wafer (ADVANTECH Co., Ltd.) was measured at 500 places thereof using a resistance meter.

2) Then, the Cu wafer was subjected to polishing using each of the CMP slurry compositions of Examples and Comparative Examples for 30 seconds, followed by measurement of thickness of the Cu wafer at the same places and comparison of the thicknesses of the wafer before and after polishing, thereby finding a removal rate (RR).

3) The standard deviation of the measured RR was calculated and RR NU (%) was obtained through division of the standard deviation by the average value of RR.

TABLE 1

| | | Example | | | | Comparative Example | | | |
|---|---|---|---|---|---|---|---|---|---|
| | | 1 | 2 | 3 | 4 | 1 | 2 | 3 | 4 |
| (A) Polishing particles (wt %) | | 0.1 | 0.1 | 0.1 | 0.1 | 0.1 | 0.1 | 0.1 | 0.1 |
| (B) Oxidant (wt %) | | 1 | 1 | 1 | 1 | 1 | 1 | 1 | 1 |
| (C) Complexing agent (mM) | | 160 | 160 | 160 | 160 | 160 | 160 | 160 | 160 |
| (C) Complexing agent (wt %) | | 1.2 | 1.2 | 1.2 | 1.2 | 1.2 | 1.2 | 1.2 | 1.2 |
| (D) Corrosion inhibitor (mM) | (d1) | 0.1 | 0.5 | 1 | — | — | — | — | — |
| | (d2) | — | — | — | 10 | — | — | — | — |
| | (d3) | — | — | — | — | — | 10 | — | — |
| | (d4) | — | — | — | — | — | — | 10 | — |
| | (d5) | — | — | — | — | — | — | — | 10 |
| | (d6) | 3 | 3 | 3 | 3 | 3 | 3 | 3 | 3 |
| (D) Corrosion inhibitor (wt %) | | 0.02 | 0.02 | 0.03 | 0.10 | 0.02 | 0.70 | 0.20 | 0.21 |
| SER (Å/min) | Cu | 29 | 27 | 25 | 10 | 30 | 15 | 10 | 13 |
| | Co | 0.3 | 0.2 | 0.1 | 10 | 80 | 12 | 15 | 13 |
| RR NU (%) | | 19 | 18 | 17 | 3 | 20 | 29 | 12 | 15 |
| Defect (ea) | | 532 | 410 | 351 | 143 | 610 | 726 | 631 | 660 |

As shown in Table 1, it may be seen that the CMP slurry compositions of Examples 1 to 4 (using a nitrite or ammonium nitrate as the corrosion inhibitor) had a low static etch rate for a cobalt film, exhibited good polishing uniformity (RR NU), and suppressed generation of surface defects. For example, the CMP slurry compositions of Examples 1 to 3 (using a nitrite) exhibited excellent properties in terms of corrosion inhibition of a cobalt film, and the CMP slurry composition of Example 4 (using ammonium nitrate) exhibited excellent properties in terms of polishing uniformity.

Conversely, it may be seen that the CMP slurry composition of Comparative Example 1 not using a corrosion inhibitor could not inhibit corrosion of a cobalt film and resulted in severe surface defects. In addition, it may be seen that the CMP slurry compositions of Comparative Examples 2 to 4 (using other nitrate-based corrosion inhibitors) exhibited poor properties in terms of corrosion inhibition of a cobalt film, despite using a larger amount of corrosion inhibitor than Examples 1 to 3, and exhibited poor polishing uniformity as compared with Example 4 using the same amount of corrosion inhibitor. In addition, it may be seen that the CMP slurry compositions of Comparative Examples 2 to 4 resulted in increased defects.

By way of summation and review, in polishing of metal wires, it may be important to reduce an etching rate while increasing a polishing rate. For example, copper wires may be easily corroded by chemicals such as an etchant, and the polishing rate can be easily increased and the etching rate is also increased together with the polishing rate, thereby causing corrosion of the copper wires. In a copper CMP process, a natural passivation oxide film (CuO or $Cu_2O$) may not be formed or may not be sufficiently formed to protect a metal from external chemical etching, and metal wires may be likely to be corroded. Thus, a passivation agent or an anti-corrosion agent may be added to a CMP slurry composition.

As described above, in CMP of copper wires, a balance between action of a chemical etching system and action of an anti-corrosion agent may be very important. Various anti-corrosion agents for copper may be used with CMP for copper wires. Examples of such anti-corrosion agents may include benzotriazole, methylbenzotriazole, imidazole, aspartic acid, and tolyltriazole. These anti-corrosion agents are organic anti-corrosion agents that form a strong bond with copper to inhibit corrosion of copper. Such an organic anti-corrosion agent could remain on the surfaces of the copper wires after CMP to form an organic residue, thereby possibly causing failure of a device.

A CMP slurry composition may use an inorganic anti-corrosion agent instead of an organic anti-corrosion agent. For example, a CMP slurry composition for copper wires may include cerium nitrate, nickel nitrate, and/or zinc nitrate as an inorganic anti-corrosion agent.

With a reduction in size of a semiconductor device and improvement in device performance, a metal having high conductivity, such as cobalt (Co) or ruthenium (Ru), may be used for an auxiliary metal layer which serves as a seed material for plating of copper wires or serves to increase conductivity. A CMP slurry composition including an inorganic anti-corrosion agent may be effective in suppressing corrosion of copper wires to some degree, but could exhibit insufficient properties in terms of corrosion inhibition of such an auxiliary metal layer.

The embodiments may provide a CMP slurry composition that may help minimize chemical loss of an auxiliary metal layer additionally formed on a copper wire.

The embodiments may provide a CMP slurry composition which may help provide improved suppression or inhibition of corrosion of both a copper wire and an auxiliary metal layer formed of a metal such as cobalt, minimize chemical loss of the copper wire and the auxiliary metal layer, and improve flatness after polishing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A CMP slurry composition for polishing a metal wire, the CMP slurry composition comprising:

polishing particles;
an oxidant;
a complexing agent;
a corrosion inhibitor; and
deionized water,
wherein the corrosion inhibitor includes an inorganic nitrite or ammonium nitrate,
wherein the inorganic nitrite or ammonium nitrate is present in an amount of 0.001 wt % to less than 1 wt %, based on a total weight of the CMP slurry composition, and
wherein the CMP slurry composition has a pH of greater than 6 and less than 8.

2. The CMP slurry composition as claimed in claim 1, wherein:
the corrosion inhibitor includes the inorganic nitrite, and
the inorganic nitrite includes sodium nitrite, potassium nitrite, ammonium nitrite, or a combination thereof.

3. The CMP slurry composition as claimed in claim 1, further comprising a surfactant, a polymeric compound, a dispersant, a pH regulator, or a combination thereof.

4. The CMP slurry composition as claimed in claim 1, wherein the CMP slurry composition includes:
about 0.01 wt % to about 20 wt % of the polishing particles;
about 0.01 wt % to about 10 wt % of the oxidant;
about 0.01 wt % to about 20 wt % of the complexing agent; and
the 0.001 wt % to less than 1 wt % of the corrosion inhibitor, all wt % being based on a total weight of the CMP slurry composition.

5. The CMP slurry composition as claimed in claim 1, wherein the CMP slurry composition has a static etch rate of about 50 Å/min or less, as measured for a cobalt film.

6. The CMP slurry composition as claimed in claim 1, wherein the CMP slurry composition has a static etch rate of about 30 Å/min or less, as measured for a copper film.

7. The CMP slurry composition as claimed in claim 1, wherein the CMP slurry composition has a removal rate non-uniformity of about 20% or less.

8. A polishing method comprising polishing metal wires using the CMP slurry composition as claimed in claim 1.

9. The polishing method as claimed in claim 8, wherein:
the corrosion inhibitor includes the inorganic nitrite, and
the inorganic nitrite includes sodium nitrite, potassium nitrite, ammonium nitrite, or a combination thereof.

10. The polishing method as claimed in claim 8, wherein the CMP slurry composition further includes a surfactant, a polymeric compound, a dispersant, a pH regulator, or a combination thereof.

11. The polishing method as claimed in claim 8, wherein the CMP slurry composition includes:
about 0.01 wt % to about 20 wt % of the polishing particles;
about 0.01 wt % to about 10 wt % of the oxidant;
about 0.01 wt % to about 20 wt % of the complexing agent;
the 0.001 wt % less than 1 wt % of the corrosion inhibitor, all wt % being based on a total weight of the CMP slurry composition.

12. The polishing method as claimed in claim 8, wherein the CMP slurry composition has a static etch rate of about 50 Å/min or less, as measured for a cobalt film.

13. The polishing method as claimed in claim 8, wherein the CMP slurry composition has a static etch rate of about 30 Å/min or less, as measured for a copper film.

14. The polishing method as claimed in claim 8, wherein the CMP slurry composition has a removal rate non-uniformity of about 20% or less.

15. The CMP slurry composition as claimed in claim 1, wherein:
the polishing particles include silica,
the oxidant includes hydrogen peroxide,
the complexing agent includes glycine, and
the corrosion inhibitor includes potassium nitrite or ammonium nitrate.

16. The CMP slurry composition as claimed in claim 1, wherein the corrosion inhibitor includes sodium nitrite or potassium nitrite.

17. The CMP slurry composition as claimed in claim 1, wherein the corrosion inhibitor includes potassium nitrite.

18. A CMP slurry composition for polishing a metal wire, the CMP slurry composition comprising:
polishing particles;
an oxidant;
a complexing agent;
a corrosion inhibitor; and
deionized water,
wherein the corrosion inhibitor includes sodium nitrite, potassium nitrite, ammonium nitrite, or a combination thereof, and
wherein the corrosion inhibitor is present in an amount of 0.001 wt % to less than 1 wt %, based on a total weight of the CMP slurry composition.

* * * * *